United States Patent
Khanna et al.

(10) Patent No.: US 7,391,200 B1
(45) Date of Patent: Jun. 24, 2008

(54) P-CHANNEL POWER CHIP

(75) Inventors: Sandeep Khanna, Los Altos, CA (US); Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/670,924

(22) Filed: Feb. 2, 2007

(51) Int. Cl.
*G06F 1/18* (2006.01)
*G05F 1/613* (2006.01)
*H01L 29/78* (2006.01)
*H01L 25/00* (2006.01)

(52) U.S. Cl. .................. 323/349; 323/350; 323/351; 257/372; 327/520; 327/566

(58) Field of Classification Search .......... 323/349, 323/350, 351; 257/372; 327/520, 566
See application file for complete search history.

(56) References Cited

U.S. PATENT DOCUMENTS 5,770,504 A   6/1998  Brown et al.
5,955,872 A * 9/1999  Grimm ................. 323/283
6,366,155 B1 * 4/2002 Moon et al. ........... 327/530
7,148,665 B2 * 12/2006 Agari et al. ........... 323/268
2007/0030061 A1 * 2/2007 Cho et al. ............. 330/10

OTHER PUBLICATIONS

Building In Reliability with Latch-Up, ESD And Hot Carrier Effects On A 0.25 μM CMOS Technology; C. Leroux, P. Salome, G. Reimbold, D. Blachier, G. Guegan, M. Bonis; Solid-State Device Research Conference, 1997. Proceeding of the 27th European, Sep. 22-24, 1997, pp. 464-467.

* cited by examiner

*Primary Examiner*—Evan Pert
(74) *Attorney, Agent, or Firm*—Shemwell Mahamedi LLP

(57) ABSTRACT

An integrated circuit device for delivering power to a load includes a P-MOS power transistor, an N-MOS bypass transistor and a gate driver circuit. The P-MOS power transistor is coupled between a supply voltage node and a power output node of the integrated circuit device, and the N-MOS bypass transistor is coupled between the power output node and a reference node of the integrated circuit device. The gate driver circuit responds to a pulse-width-modulated (PWM) control signal by outputting an active-low drive-enable signal to a gate terminal of the P-MOS power transistor and an active-high bypass-enable signal to a gate terminal of the N-MOS bypass transistor during respective, non-overlapping intervals.

17 Claims, 3 Drawing Sheets

(Prior-Art)

(Prior-Art)

(Prior-Art)

P-CHANNEL POWER CHIP

TECHNICAL FIELD

The present invention relates to power-delivery integrated circuit devices.

BACKGROUND

Power delivery in modern integrated circuit (IC) systems has become increasingly complex as supply voltages fall and power demands become more variant. A number of modern microprocessor systems, for example, require load voltage to be dynamically adjusted in response to processing demand, with voltage overshoot/undershoot to be maintained within closely specified ranges as load voltages change. IC-based power regulation and delivery systems have been developed to meet these requirements.

FIG. 1 illustrates a prior-art IC-based power delivery system 100 that includes a controller IC 101 and multiple power-stage ICs $103_1$-$103_N$. The controller IC 101 outputs respective pulse-width-modulated (PWM) control signals 108 (Pctrl1-PctrlN), shown for example in FIG. 2, to the power-stage ICs $103_1$-$103_N$ which respond by delivering respective currents to a load 119, each at a time and for a duration determined by the duty cycle of the corresponding PWM control signal. As shown in FIG. 2, each PWM control signal includes a pulse 122 per switching interval ($T_{SWITCH}$), with the individual pulses $122_1$-$122_N$ delivered to each power-stage IC $103_1$-$103_N$ being phase staggered so that the power-stage ICs 103 deliver load current at different times. By this arrangement, power delivery systems may be constructed using as many power-stage ICs as necessary to meet the peak power requirements of a given application. Also, the controller may modify the duty cycle of the PWM control signals to dynamically increase/decrease power delivered to the load and thus respond to fluctuating power demand.

As shown in the detail view of power-stage IC $103_1$, each IC 103 includes an N-MOS (N-channel metal oxide semiconductor) power transistor 105, N-MOS bypass transistor 107 and an N-MOS gate driver circuit 109. The gate driver circuit 109 outputs an active-high drive-enable signal 110 ($N_{DRV}$) to switch the N-MOS power transistor 105 to a conducting state, and thereby switchably couple power source, V+ (e.g., a 12-volt source), to a power output node 114 ($V_{OUT}$) of the power-stage IC. The power output node 114 is coupled via inductor 115 ($L_F$) to a variable-resistance load 119 (modeled by resistor $R_L$), which is coupled between inductor 115 and a grounded return node 116 (Ret) of the power-stage IC. Filter capacitor 117 ($C_F$) is coupled in parallel with the load 119 and, together with inductor 115, forms a lowpass filter for maintaining a relatively steady-state supply voltage ($V_{LOAD}$ 120) across load 119.

Referring to FIGS. 1 and 3, the gate driver circuit 109 maintains the active-high drive-enable signal 110 ($N_{DRV}$) for the duration of the control pulse $122_1$ conveyed in the PWM control signal 108 (the pulses $122_1$-$122_4$ for an exemplary set of four power stage ICs are shown collectively in FIG. 3, with the pulses for ICs $122_2$-$122_N$ shown in dashed outline) so that the amount of current delivered to the load 119 by each power-stage IC 103 is proportional to the duty cycle of the corresponding PWM control signal, Pctrl1-PctrlN (i.e., wider control pulse width yields more current to the load 119 per switching interval). As shown, the output voltage 114 quickly rises to the V+ level when the drive-enable signal 110 is raised. At the falling edge of the control pulse $122_1$, the drive-enable signal 110 is deasserted (thus concluding drive-enable pulse 126), switching off the N-MOS power transistor 105 and thus concluding the power-delivery interval for power stage $103_1$. Consequently, the current through inductor 115 begins to fall, resulting in a slightly negative voltage spike 132 (<0v) during the dead time interval 130 between deassertion of the drive-enable signal 110 and assertion of the bypass signal 112 ($N_{BYP}$). When the bypass signal 112 is asserted, bypass transistor 107 begins conducting to provide a shunt path for the inductor current, thus restoring the output voltage 114 to a level at or near the ground potential. The bypass transistor 107 is switched off (i.e., by deassertion of bypass signal 112, thus concluding bypass pulse 128) prior to assertion of the drive-enable signal 110 in the subsequent switching interval. During the bypass interval within power stage $103_1$ (i.e., during assertion of bypass signal 112), the power-delivery and bypass operations are repeated within the subsequent power stage ICs $103_2$-$103_N$ in response to phase-staggered control pulses 122 ($122_1$-$122_4$ in the diagram of FIG. 3), yielding the pulse waveforms shown in dashed outline at the respective $V_{OUT}$ nodes 114 of the power stage ICs.

Because the supply current during the power delivery interval of a given power stage IC (i.e., during the drive-enable pulse 126) flows through the channel of N-MOS power transistor 105, it becomes important to lower the on-resistance ($R_{ON}$) of the power transistor 105, and thus avoid conduction power loss ($I^2R$ loss) and resulting heat generation. Accordingly, it is desirable to drive the N-MOS power transistor 105 well into saturation during the power delivery cycle to keep $R_{ON}$ low. Unfortunately, this generally means asserting the drive-enable signal, $N_{DRV}$, at a voltage substantially above V+, and thus requires circuitry to generate a voltage source boosted above V+ for the drive-enable signal. Also, the higher gate voltage generally necessitates a thicker oxide layer within the power transistor 105, which reduces device transconductance and thus, in turn, requires a larger transistor to establish the same current. Consequently, considerable die area is consumed to provide for both boosted voltage generation circuitry within the gate driver circuit 109 (i.e., for the drive-enable signal 110) and implementation of the N-MOS power transistor 105 itself, driving up overall size and cost of the power stage IC 103; a size and cost increase that is multiplied by the number of power stage ICs 103 required in a given application.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
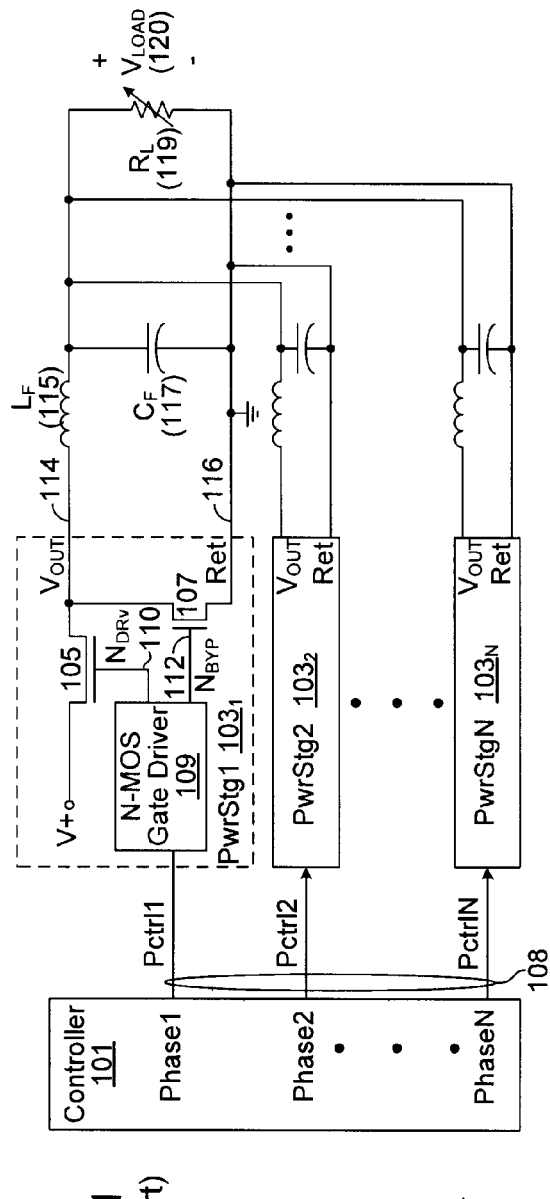
FIG. 1 illustrates a prior-art IC-based power delivery system.
Figure 2:
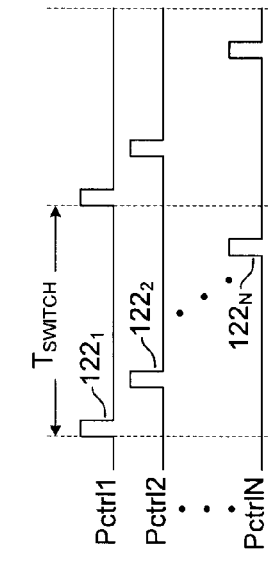
FIG. 2 illustrates a set of pulse-width modulated control signals generated within the prior-art IC-based power delivery system of FIG. 1.
Figure 3:
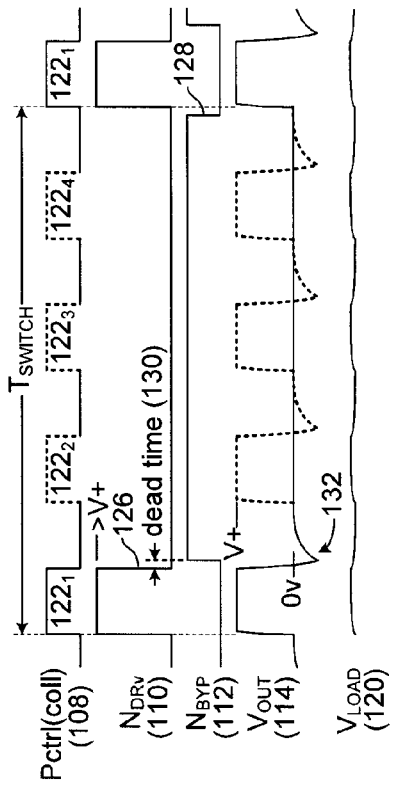
FIG. 3 illustrates waveforms generated at various nodes within the prior-art IC-based power delivery system of FIG. 1.

A power-delivery integrated circuit (IC) device having a P-MOS (P-channel metal oxide semiconductor) power transistor, N-MOS bypass transistor and complementary-MOS (C-MOS) gate driver is disclosed in various embodiments, including an embodiment in which the drains of the P-MOS power and N-MOS bypass transistors are directly coupled to one another. As discussed in more detail below, coupling the drains of P-MOS and N-MOS transistors within a P-type semiconductor substrate yields a pair of parasitic bipolar junction transistors (BJTs) that may inadvertently and undesirably be switched to a conducting state, known as latch-up; a state that generally results in device malfunction and, if the BJT current is high enough, device destruction. Latch-up is typically triggered by an event that forward-biases a BJT P-N junction which, as it turns out, is precisely the circumstance that results during the dead time interval shown in FIG. 3. More specifically, when the power transistor 105 of the prior-art power-stage IC is switched off, the resistance to current change within inductor $L_F$ yields a negative voltage at the drain of the power stage transistor 105 (i.e., the voltage at $V_{OUT}$ goes negative, forward biasing the body diode formed between the P-type substrate and the drain terminal of bypass transistor 107 to maintain the current through inductor $L_F$). Consequently, N-MOS transistors have conventionally been used to implement the power transistor, thus avoiding the latch-up problem. In embodiments disclosed herein, a P-MOS power transistor is used despite the propensity for latch-up, thereby enabling an active-low drive-enable signal to be used and thus avoiding the need for boosted-voltage circuitry (i.e., for the drive-enable signal) and for the large, thick-oxide N-MOS power transistors used in conventional designs. In different embodiments, various safeguards are provided to avoid device latch-up including, without limitation, instituting a minimum spacing between the P-MOS power transistor and N-MOS bypass transistor to reduce the gain product of the parasitic BJTs, providing a supply-tapped guard ring around the N-well in which the P-MOS power transistor is formed, and/or forming a grounded guard ring around the N-MOS bypass transistor and so forth.

Figure 4:
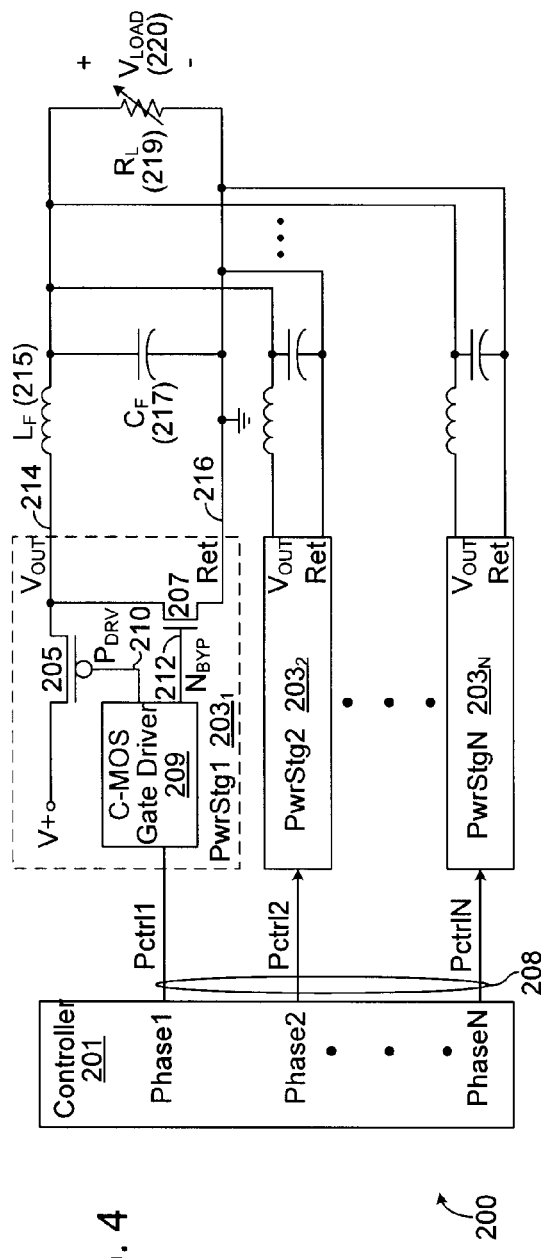
FIGS. 4 and 5 illustrate an embodiment of a power delivery system and corresponding waveform diagram.
Figure 5:
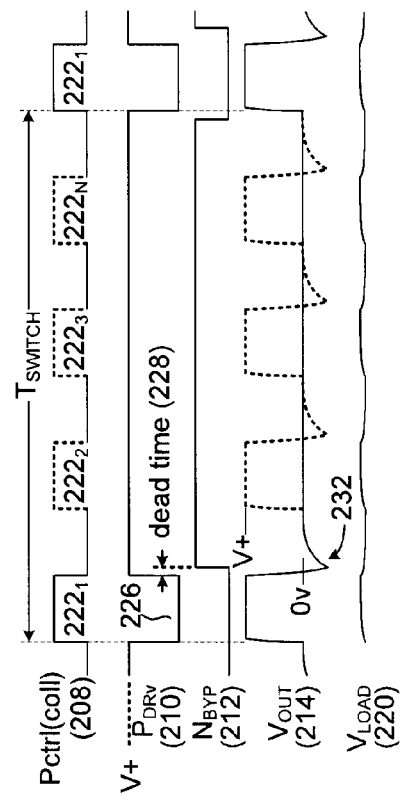

FIGS. 4 and 5 illustrate an embodiment of a power delivery system 200 and corresponding waveform diagram. The power delivery system 200 includes a controller 201 and multiple power-stage ICs $203_1$-$203_N$. The controller 201 outputs respective pulse-width-modulated (PWM) control signals (Pctrl1-PctrlN, shown collectively as control signals 208) to the power-stage ICs 203 which, in response, deliver respective currents to load 219 ($R_L$), each at a time and for a duration indicated by the duty cycle of the incoming PWM control signal. In one embodiment, each of the PWM control signals includes one pulse per switching interval ($T_{SWITCH}$), with the pulses delivered to the various power-stage ICs 203 being phase offset from one another so as to establish a substantially equal phase spacing over the switching interval. This arrangement is depicted in FIG. 5, with the pulses delivered to all the power-stage ICs $203_1$-$203_N$ shown collectively as "Pctrl (col1)," and showing the pulses delivered to an exemplary set of four power-stage ICs $203_2$-$203_4$ in dashed outline). There may be more or fewer power-stage ICs 203 in alternative embodiments. Also, control signals other than PWM control signals 208 may be used to control the operation of the power-stage ICs (e.g., digital control signals, or other types of analog control signals).

As shown in the detail view of power-stage IC $203_1$, each power-stage IC 203 includes a P-MOS power transistor 205, an N-MOS bypass transistor 207 and a C-MOS (complementary MOS) gate driver circuit 209. The gate driver circuit 209 responds to each pulse conveyed in the incoming PWM control signal (Pctrl1) by asserting an active low drive-enable signal 210 (i.e., lowering signal, $P_{DRV}$) and thereby switching the P-MOS power transistor 205 to a conducting state to deliver supply current (sourced by supply node V+) to one or more devices which form load 220 (modeled by lumped, time-varying load resistance 219, $R_L$) via the inductor-capacitor (LC) filter network formed by series-coupled inductor 215 ($L_F$) and parallel-coupled filter capacitor 217 ($C_F$). Because the P-MOS transistor 205 is switched on by an active-low signal, the drive-enable signal 210 may be asserted at, for example, the ground potential, and deasserted at the supply potential, V+, thus obviating the boosted voltage generation circuitry typically required in prior-art N-MOS drive-transistor architectures, and also obviating the increased oxide layer thickness in the power transistor itself and enabling a substantially smaller transistor to be used. In the embodiment shown, the C-MOS gate driver 209 asserts (i.e., lowers) the active-low drive-enable signal 210 in response to a rising edge in the corresponding PWM control signal (Pctrl1), and deasserts (raises) the drive-enable signal 210 at the falling edge of the PWM control signal (i.e., at the conclusion of the control pulse 226). The gate driver 209 institutes a brief time delay, referred to herein as a dead time 228, after deassertion of the drive-enable signal and prior to assertion of an active-high bypass signal 212. The bypass signal 212 switches on N-MOS bypass transistor 207, thus providing a shunt source of the current flowing through inductor 215. The bypass signal 212 is lowered (deasserted) just prior to the power delivery interval within the ensuing switching interval (i.e., prior to the next assertion of the drive-enable signal 210). The LC filter smooths the pulsing output voltage that appears at node $V_{OUT}$ (214) to produce a substantially steady-state load voltage 216 ($V_{LOAD}$) as shown in FIG. 5. Note that the ripple shown in the load voltage 216 is exaggerated to illustrate the relation between the voltage at node $V_{OUT}$ 214 and the charge/discharge cycles for filter capacitor 217.

Still referring to FIGS. 4 and 5, it can be seen that, in the dead time 228 between assertion of the active-low drive-enable signal 210 and the active-high bypass signal 212, the dropping inductor current causes the output voltage ($V_{OUT}$) 214 to drop below ground as shown at 232 (below zero volts in this example). Because this voltage appears at the drain-to-drain junction of the P-MOS power transistor 205 and N-MOS bypass transistor 207, the transistor arrangement of FIG. 4 has the propensity for entering into a latch-up condition in which parasitic bipolar junction transistors (BJTs) become undesirably latched into a conducting state.

Figure 6:
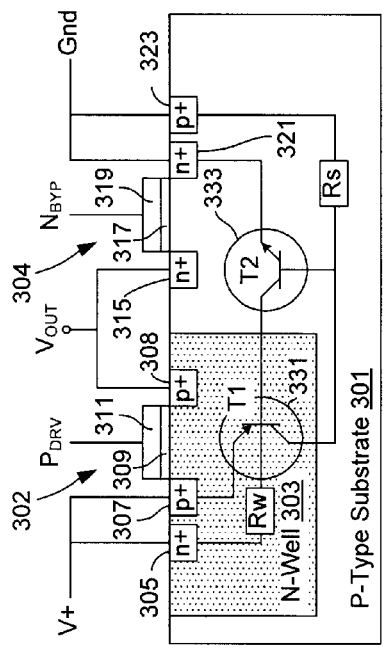
FIG. 6 illustrates a profile view of an embodiment of the P-MOS power transistor and N-MOS bypass transistor within a P-type semiconductor substrate.

FIG. 6 illustrates a profile view of an embodiment of the P-MOS power transistor 302 and N-MOS bypass transistor 304 within a P-type semiconductor substrate 301, and the vertical and lateral parasitic BJTs 331 and 333, respectively) which result from the various P and N regions thereof. The P-MOS power transistor 302 is formed within an N-well 303 (i.e., a negatively-doped region within the P-type substrate 301) and includes a P+ (i.e., positively doped) source node 307, P+ drain 308, and a gate formed by oxide layer 309 and polysilicon layer 311. As shown, source 307 is coupled to supply voltage node V+, drain 308 is coupled to the output voltage node $V_{OUT}$, and gate terminal (309/311) is coupled to receive the drive-enable signal, $P_{DRV}$. Also, the N-well (303) itself is biased to a positive potential by a connection through N+ node 305 (i.e., negatively doped node) to the supply voltage node, V+. The N-MOS bypass transistor 304 is formed by an N+ (i.e., negatively doped) source node 321, N+ drain node 315 and a gate formed by oxide layer 317 and polysilicon layer 319. Source 321 is coupled to a ground node (Gnd), drain 315 is coupled to output voltage node, $V_{OUT}$ (and thus to drain 308 of P-MOS power transistor 302) and the gate terminal (317/319) is coupled to receive the bypass signal, $N_{BYP}$. Also, the P-type substrate 301 (or body) is grounded by a connection through P+ node 323 to the ground node.

Still referring to FIG. 6, the P+ source 307 and N-well 303 of power transistor 302, together with the P-type substrate 301, form the emitter, base and collector, respectively, of a parasitic, PNP bipolar junction transistor 331 (T1, referred to herein as the vertical BJT), and the N-well 303, P-type substrate 301, together with source 321 of the bypass transistor 304, form the collector, base and emitter, respectively, of a parasitic NPN bipolar junction transistor 333 (T2, referred to herein as the lateral BJT). As shown, the supply voltage node is coupled to the base of T1 via N+ node 305 and thus pulls the base of T1 to V+ through a resistive path (modeled by $R_W$) within N-well 303. Also, the ground voltage node is coupled to the base of T2 via P+ node 323 and thus pulls the base of T2 to ground through a resistive path (modeled by $R_S$) within substrate 301.

As discussed, latch-up tends to occur in response to a negative voltage at the drain-coupled $V_{OUT}$ node, which induces a current to flow into the base of T2, causing T2 to conduct (the collector current being a product of the lateral BJT gain, $\beta 2$, and the base current). The T2 collector current flows from N+ node 305 through N-well resistance, $R_W$, and therefore causes the voltage at the base of T1 to drop and thus for T1 to begin conducting. The current through T1 (a product of the vertical BJT gain, $\beta 1$ and the T1 base current) flows through the substrate resistance, $R_S$ (i.e., the resistance through the substrate to P+ terminal 323), causing the base voltage of transistor T2 to increase, and therefore further forward biasing the base to emitter junction and increasing the current through T2. Thus, the positive-feedback interconnection of the parasitic BJTs 331 and 333 is such that, when sufficient current flow into the base of T2 is induced, both BJTs may become latched in a conducting state, with the conducted current resulting in power dissipation and thus heat generation in the N-well 303 and substrate 301 (i.e., $I^2R$ power dissipation in the N-well and substrate resistances). Generally this condition results in complete or partial circuit malfunction at least and, if the current is sufficient, may destroy the device.

Figure 7A:
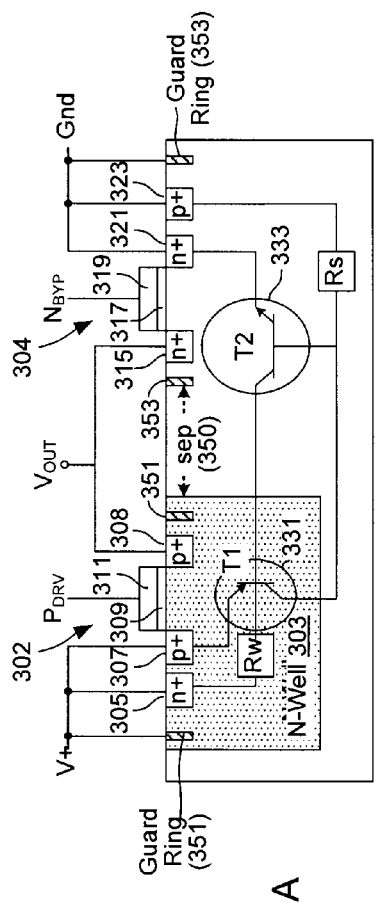
FIG. 7A illustrates techniques and structures applied within the device of FIG. 6 to prevent or reduce likelihood of device latch-up.

Referring to FIG. 7A, which depicts a profile view of an exemplary layout of power and bypass transistors 302 and 304, in one embodiment, latch-up is prevented, despite the negative voltage transient at the $V_{OUT}$ node by increasing the separation distance 350 (Sep) between the power and bypass transistors 302 and 304, for example and without limitation, to at least 50 μm (50 microns), and thereby increasing the width of the base of device T2, thus lowering $\beta 2$ and therefore the gain product $\beta 1*\beta 2$. The reduced gain product makes latch-up less likely, as the T2 collector current (and thus the T1 base current) is lowered for a given transient response (i.e., less current flows into the base of T2 in response to a negative $V_{OUT}$ transient). Additionally or alternatively, positively-biased N+ guard ring 351 (e.g., a layer of negatively doped (N+) material) may be provided to absorb carriers within the N-Well, lowering the Rw resistor value by introducing another resistive path in parallel to N-well resistor Rw and thereby reducing the susceptibility to latch-up. Similarly, ground taps (i.e., ground-connected P+ guard ring 353) may be disposed around the P-MOS power transistor 304 to absorb carriers in the vicinity of T2, lowering the Rs resistor value by introducing another resistive path in parallel to P-type substrate resistor Rs and thereby further reducing the likelihood for latch-up. Some of the other process techniques that may be employed to reduce latch-up propensity include, without limitation, trench isolation (reducing carrier mobility and hence current) and employing an epitaxial substrate (which lowers the substrate resistance, Rs).

Figure 7B:
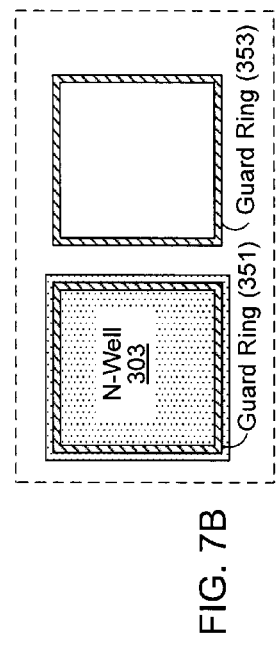
FIG. 7B illustrates a top view of the exemplary power and bypass transistor layout of FIG. 7A.

FIG. 7B illustrates a top view of the exemplary power and bypass transistor layout of FIG. 7A, illustrating the disposition of N+ guard ring 351 within N-well 303, P+ guard ring 353, and the separation distance 350 between them. Although the guard rings 351 and 353 are illustrated as continuous structures, each may be decomposed into multiple guard ring segments, and each may have geometries different from that shown.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit device for delivering power to a load, the integrated circuit device comprising:
    a P-type metal oxide semiconductor (P-MOS) power transistor coupled between a supply voltage node and a power output node of the integrated circuit device;
    an N-type metal oxide semiconductor (N-MOS) bypass transistor coupled between the power output node and a reference node of the integrated circuit device; and
    a gate driver circuit to receive a pulse-width-modulated (PWM) control signal and to output, in response to the PWM control signal, an active-low drive-enable signal to a gate terminal of the P-MOS power transistor and an active-high bypass-enable signal to a gate terminal of the N-MOS bypass transistor during respective, non-overlapping intervals.

2. The integrated circuit device of claim 1 wherein the P-MOS power transistor comprises a negatively-doped well disposed within a semiconductor substrate of the integrated circuit device, and the N-MOS bypass transistor comprises a negatively-doped drain node that is separated from the negatively-doped well by at least fifty (50) microns (μm).

3. The integrated circuit device of claim 1 wherein the P-MOS power transistor comprises a negatively-doped well disposed within a semiconductor substrate of the integrated circuit device and wherein the integrated circuit device further comprises a guard ring coupled to the reference node and disposed between the negatively-doped well and the semiconductor substrate to reduce resistance between a negatively-doped terminal, disposed within the negatively-doped well, and the ground reference node.

4. The integrated circuit device of claim 1 wherein the gate driver circuit includes control circuitry to lower the drive-enable signal for an interval indicated by the width of a pulse within the PWM control signal, and then to raise the drive-enable signal prior to outputting the active-high bypass-enable signal.

5. The integrated circuit device of claim 1 wherein the gate driver circuit includes control circuitry to lower the drive-enable signal in response to a leading edge of a pulse within the PWM control signal, maintain the drive-enable signal in a logic low state for the duration of the pulse, and raise the drive-enable signal at a trailing edge of the pulse.

6. The integrated circuit device of claim 5 wherein the leading edge of the pulse is a rising edge, and the trailing edge of the pulse is a falling edge.

7. The integrated circuit device of claim 1 wherein the gate driver circuitry comprises control circuitry to raise the active-high bypass-enable signal for a predetermined interval following detection of a pulse in the PWM control signal.

8. The integrated circuit device of claim 1 wherein the gate driver circuitry comprises control circuitry to raise the active-high bypass-enable signal for a predetermined interval following the trailing edge of a pulse in the PWM control signal.

9. The integrated circuit device of claim 1 wherein the gate driver circuitry comprises control circuitry to raise the active-high bypass-enable signal for a duration determined, at least in part, by the PWM control signal.

10. A method of operation within an integrated circuit device, the method comprising:
    receiving a pulse-width-modulated (PWM) control signal; and
    switching a P-type metal oxide semiconductor (P-MOS) power transistor to a conductive state for the duration of a pulse within the PWM control signal to switchably couple a power supply node to an output of the integrated circuit device.

11. The method of claim 10 further comprising:
    switching the P-MOS power transistor to a substantially non-conductive state at the conclusion of the pulse within the PWM control signal; and
    switching an N-type metal oxide semiconductor (N-MOS) bypass transistor to a conductive state after switching the P-MOS power transistor to the substantially non-conductive state.

12. The method of claim 11 wherein switching the N-MOS bypass transistor to the conductive state after switching the P-MOS power transistor to the substantially non-conductive state comprises delaying for a dead time interval after raising a drive-enable signal that is supplied to a gate of the P-MOS power transistor and prior to raising a bypass signal that is supplied to a gate terminal of the N-MOS bypass transistor.

13. The method of claim 10 wherein switching the P-MOS power transistor to a conductive state for the duration of a pulse within the PWM control signal comprises lowering a drive-enable signal in response to a leading edge of the pulse within the PWM control signal, and then raising the drive-enable signal in response to a trailing edge of the pulse within the PWM control signal, the drive-enable signal being supplied to a gate terminal of the P-MOS power transistor.

14. An integrated circuit device for delivering power to a load, the integrated circuit device comprising:
   means for receiving a pulse-width-modulated (PWM) control signal; and
   means for switching a P-type metal oxide semiconductor (P-MOS) power transistor to a conductive state for the duration of a pulse within the PWM control signal to switchably couple a power supply node to an output of the integrated circuit device.

15. The integrated circuit device of claim 14 further comprising:
   means for switching the P-MOS power transistor to a substantially non-conductive state at the conclusion of the pulse within the PWM control signal; and
   means for switching an N-type metal oxide semiconductor (N-MOS) bypass transistor to a conductive state after switching the P-MOS power transistor to the substantially non-conductive state.

16. The method of claim 14 wherein the means for switching the P-MOS power transistor to a conductive state for the duration of a pulse within the PWM control signal comprises means for lowering a drive-enable signal in response to a leading edge of the pulse within the PWM control signal, and then raising the drive-enable signal in response to a trailing edge of the pulse within the PWM control signal, the drive-enable signal being supplied to a gate terminal of the P-MOS power transistor.

17. Computer-readable media having information embodied therein that includes a description of an integrated circuit device for delivering power to a load, the information including descriptions of:
   a P-type metal oxide semiconductor (P-MOS) power transistor coupled between a supply voltage node and a power output node of the integrated circuit device;
   an N-type metal oxide semiconductor (N-MOS) bypass transistor coupled between the power output node and a reference node of the integrated circuit device; and
   a gate driver circuit to receive a pulse-width-modulated (PWM) control signal and to output, in response to the PWM control signal, an active-low drive-enable signal to a gate terminal of the P-MOS power transistor and an active-high bypass-enable signal to a gate terminal of the N-MOS bypass transistor during respective, non-overlapping intervals.

* * * * *